(12) United States Patent
Lin et al.

(10) Patent No.: US 11,683,896 B2
(45) Date of Patent: Jun. 20, 2023

(54) BRACKET MODULE FOR COMPLIANT AND NON-COMPLIANT ARM AND RAISER COMPONENTS OF AN INFORMATION HANDLING SYSTEM

(71) Applicant: DELL PRODUCTS, LP, Round Rock, TX (US)

(72) Inventors: Chung-An Lin, Zhonghe District (TW); Yi-Change Yeh, Taipei (TW); Yan-Zih Chen, Taipei (TW)

(73) Assignee: Dell Products L.P., Round Rock, TX (US)

( * ) Notice: Subject to any disclaimer, the term of this patent is extended or adjusted under 35 U.S.C. 154(b) by 302 days.

(21) Appl. No.: 17/037,877

(22) Filed: Sep. 30, 2020

(65) Prior Publication Data
US 2022/0099240 A1 Mar. 31, 2022

(51) Int. Cl.
*H05K 5/02* (2006.01)

(52) U.S. Cl.
CPC .................................. *H05K 5/0234* (2013.01)

(58) Field of Classification Search
None
See application file for complete search history.

(56) References Cited

U.S. PATENT DOCUMENTS

| | | | |
|---|---|---|---|
| 10,851,935 B1* | 12/2020 | Huang | G06F 1/1656 |
| 2006/0060728 A1* | 3/2006 | Yuan | F16M 11/10 |
| | | | 248/125.1 |
| 2010/0188812 A1 | 7/2010 | Morrison et al. | |
| 2010/0219303 A1* | 9/2010 | Matsui | F16M 11/105 |
| | | | 248/316.1 |
| 2012/0131826 A1* | 5/2012 | Dai | F16M 11/041 |
| | | | 248/158 |
| 2012/0250232 A1* | 10/2012 | Li | F16M 11/041 |
| | | | 361/679.01 |
| 2013/0044411 A1* | 2/2013 | Zhen | F16M 11/22 |
| | | | 361/679.01 |
| 2019/0261525 A1 | 8/2019 | Chiu et al. | |
| 2020/0081483 A1* | 3/2020 | Laurent | F16M 11/10 |

* cited by examiner

*Primary Examiner* — James Wu
*Assistant Examiner* — Christopher L Augustin
(74) *Attorney, Agent, or Firm* — Larson Newman, LLP

(57) ABSTRACT

A combination mounting bracket for an information handling system includes a main bracket and an adjustable bracket. The main bracket is securely mounted on a display device of the information handling system. The adjustable bracket includes a mounting surface and multiple standoffs. The mounting surface is configured to be placed in physical communication with a stand for the display device. The standoffs are in physical communication with the mounting surface and with the main bracket. The standoffs are configured to transition between an extended position and a compressed position.

18 Claims, 12 Drawing Sheets

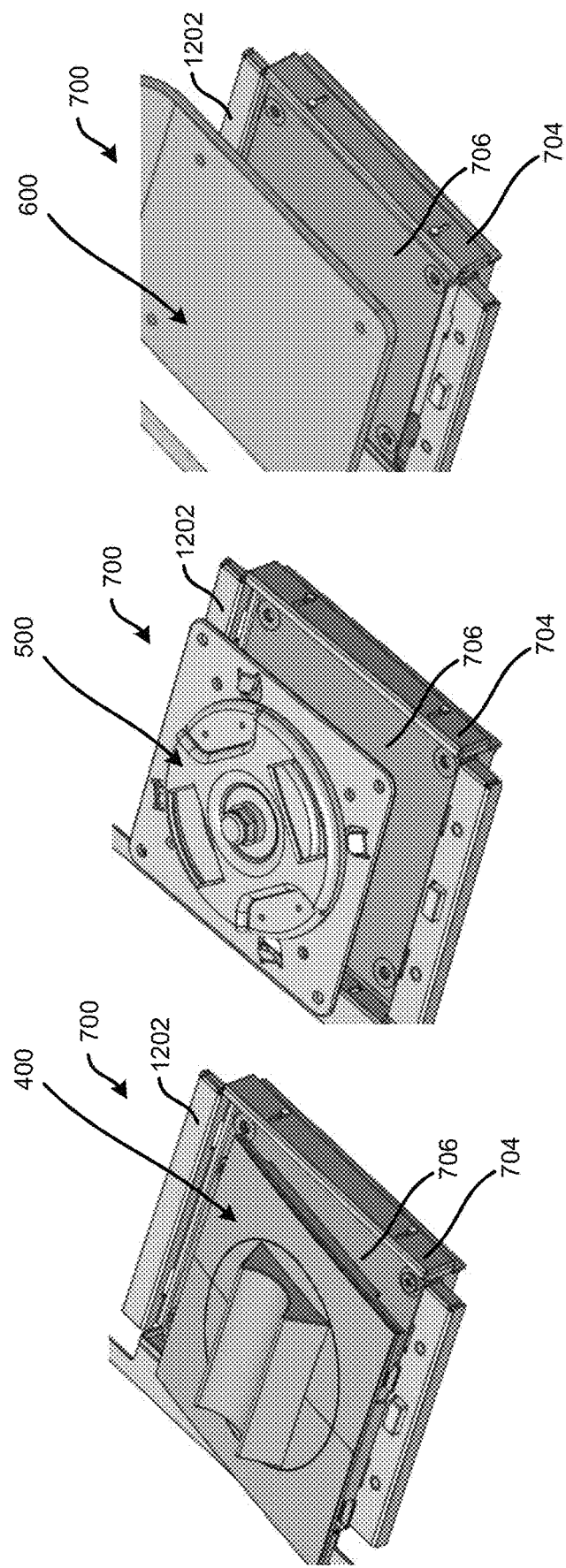

BRACKET MODULE FOR COMPLIANT AND NON-COMPLIANT ARM AND RAISER COMPONENTS OF AN INFORMATION HANDLING SYSTEM

FIELD OF THE DISCLOSURE

The present disclosure generally relates to information handling systems, and more particularly relates to a bracket module for compliant and non-compliant arm and raiser components of an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A combination mounting bracket for an information handling system includes a main bracket and an adjustable bracket. The main bracket is securely mounted on a display device of the information handling system. The adjustable bracket includes a mounting surface and multiple standoffs. The mounting surface is configured to be placed in physical communication with a stand for the display device. The standoffs are in physical communication with the mounting surface and with the main bracket. The standoffs are configured to transition between an extended position and a compressed position.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 22 is a diagram illustrating an embodiment of an stand head connecting to the combination mounting bracket according to at least one embodiment of the present disclosure;

FIG. 23 is a diagram illustrating another embodiment of an stand head connecting to the combination mounting bracket according to at least one embodiment of the present disclosure; and FIG. 24 is a diagram illustrating another embodiment of a stand head connecting to the combination mounting bracket according to at least one embodiment of the present disclosure.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
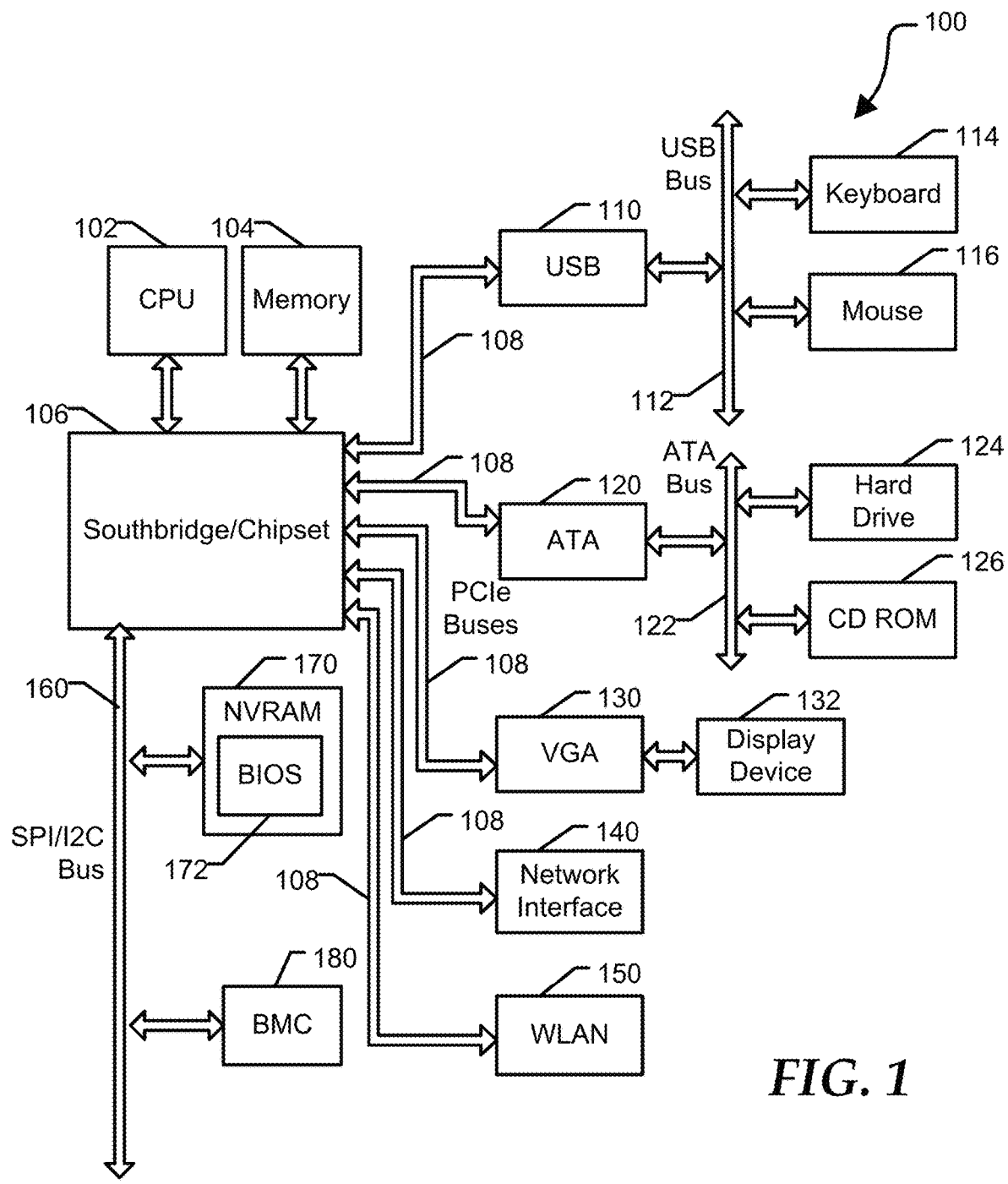
FIG. 1 is a block diagram of a general information handling system according to an embodiment of the present disclosure.

FIG. 1 illustrates a general information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

Information handling system 100 including a processor 102, a memory 104, a southbridge/chipset 106, one or more PCIe buses 108, a universal serial bus (USB) controller 110, a USB 112, a keyboard device controller 114, a mouse device controller 116, a configuration an ATA bus controller 120, an ATA bus 122, a hard drive device controller 124, a compact disk read only memory (CD ROM) device controller 126, a video graphics array (VGA) device controller 130, a network interface controller (NIC) 140, a wireless local area network (WLAN) controller 150, a serial peripheral interface (SPI) bus 160, a NVRAM 170 for storing BIOS 172, and a baseboard management controller (BMC) 180. In an example, chipset 106 may be directly connected to an individual end point via a PCIe root port within the chipset and a point-to-point topology as shown in FIG. 1. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One or more components can be integrated together. For example, portions of southbridge/chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

In an example, information handling system 100 may be any suitable device including, but not limited to, information handling system 100 and servers 112, 114, and 116 of FIG. 1. Information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

Figure 2:
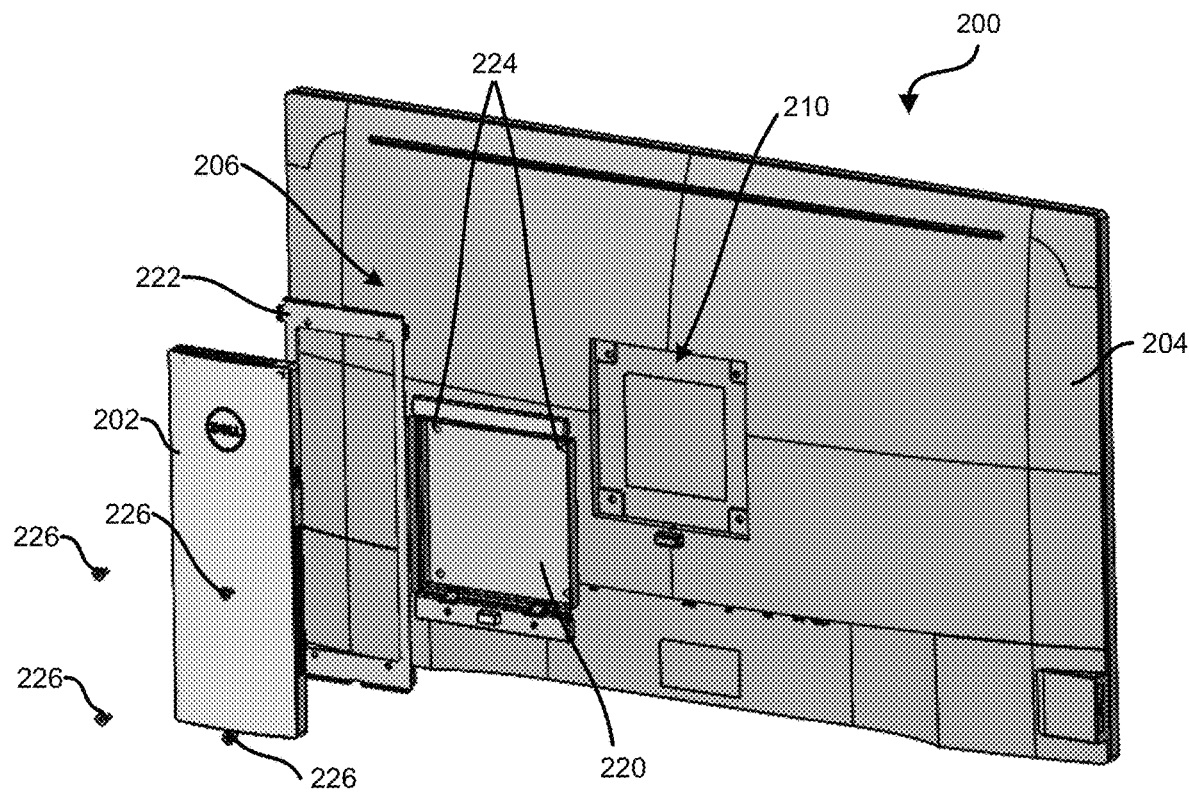
FIGS. 2 and 3 are diagrams illustrating a mounting bracket and an information handling system being attached to a display device according to at least one embodiment of the present disclosure.
Figure 3:
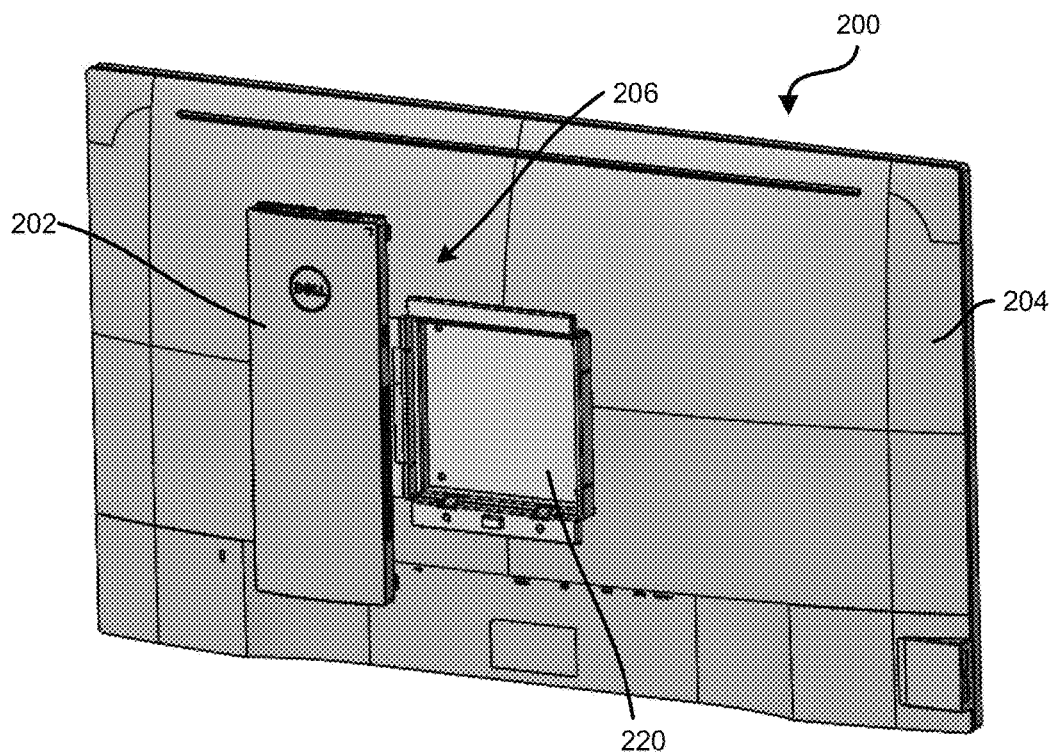

FIGS. 2 and 3 illustrate an information handling system 202, a display device 204, and a combination mounting bracket 206 according to at least one embodiment of the present disclosure. In an example, display device 204 includes a mounting location 210 to receive combination mounting bracket 206. In certain examples, combination mounting bracket 206 includes a main bracket 220 and an information handling system bracket 222, and multiple mounting holes 224. Information handling system bracket 222 may interface with information handling system 202 to secure the information handling system to combination mounting bracket 206 and display device 204. Combination mounting bracket 206 may be secured to mounting location 210 of display device 204 via screws 226 being inserted through mounting holes 224 in main bracket 220 and attached to holes within mounting location 210.

Referring now to FIG. 3, information handling system 202 is secured to combination mounting bracket 206 and main bracket 220 is secured in physical communication with display device 204. In an example, information handling system 202 may be any suitable information handling system including, but not limited to, information handling system 100 of FIG. 1 and may include some or all of the components of the information handling system. In certain example, information handling system 202 may be a zero foot print (ZFP) information handling system. Combination mounting bracket 206 may be any suitable mounting bracket including, but not limited to a Video Electronics Standards Association (VESA) bracket. However, a user of information handling system 202 and display device 204 may have a stand that is not compliant with a VESA bracket. In previous systems a VESA mounting bracket would not be able to connect with a non-VESA compliant display device stand. As described herein, combination mounting bracket 204 may be configured to connect with both VESA compliant and non-VESA compliant display device stands.

In certain examples, VESA compliant versus non-VESA compliant stand heads may be classified based on one or more physical features of a pad of the stand head. For example, a pad size for a VESA compliant stand head may have outer edge dimensions within a particular range of lengths, such that the stand head may fit within a VESA compliant mounting bracket. Also, a VESA compliant stand head may have a particular configuration of mounting holes, such as location and distance apart, so that the stand head may connect to a VESA compliant mounting bracket. A non-VESA compliant stand head may have one or more configurations that do not meet the configurations of a VESA compliant mounting bracket. For example, a non-VESA compliant stand head may have outer edge dimensions that are larger than the particular range of lengths for a VESA compliant stand head, such that the non-VESA compliant stand head may be too large to fit within a VESA compliant mounting bracket.

Figure 4:
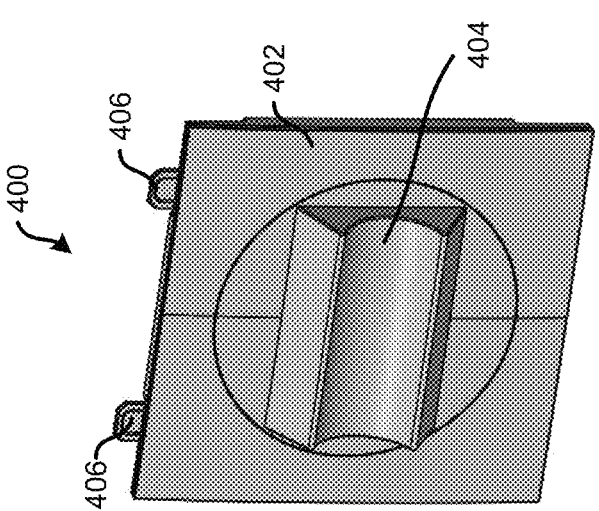
FIG. 4 is a diagram of a stand head for mounting a display device on a stand according to at least one embodiment of the present disclosure.

FIG. 4 illustrates a stand head 400 for mounting a display device, such as display device 204, on a stand according to at least one embodiment of the present disclosure. Stand head 400 includes a main plate 402, a swivel panel 404, and tabs 406. In an example, stand head 400 may be any suitable stand head to interface with a combination mounting bracket, such as combination mounting bracket 206 of FIG. 2. For example, stand head 400 may be a VESA compliant stand head, such that the stand head may fit within main bracket 220 of FIG. 2. For example, the outer edges of main plate 402 may fit within the side walls of main bracket 220. In certain examples, tabs 406 may be inserted within holes of main bracket 220 to secure stand head 400 within the main bracket of combination mounting bracket 206.

Figure 5:
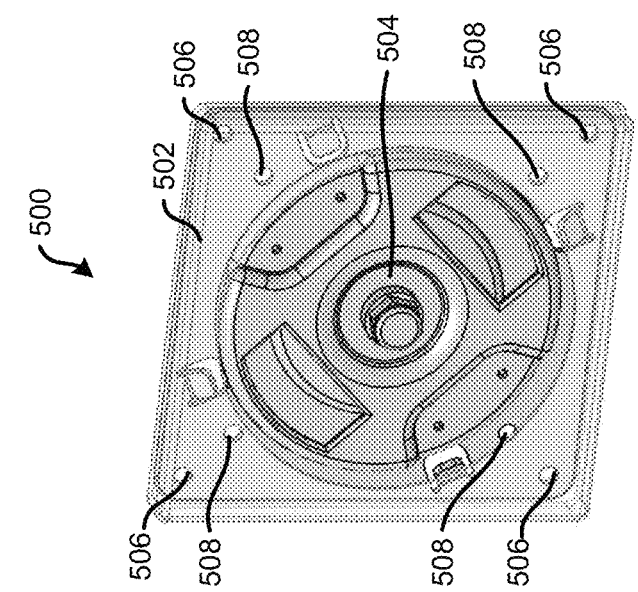
FIG. 5 is a diagram of another embodiment of a stand head for mounting a display device on a stand according to at least one embodiment of the present disclosure.

FIG. 5 illustrates a stand head 500 for mounting a display device, such as display device 204, on a stand according to at least one embodiment of the present disclosure. Stand head 500 includes a main plate 502 and a swivel panel 504. Main plate 502 includes a first set of mounting holes 506 and a second set of mounting holes 508. In an example, stand head 500 may be any suitable stand head to interface with a combination mounting bracket, such as combination mounting bracket 206 of FIG. 2. For example, stand head 500 may be a VESA compliant stand head, such that the stand head may fit within main bracket 220 of FIG. 2. For example, the outer edges of main plate 502 may fit within the side walls of main bracket 220. In certain examples, stand head 500 may be inserted within main bracket 220, and screws may be inserted through holes 506 or holes 508 to secure stand head 500 to the main bracket of combination mounting bracket 206.

Figure 6:
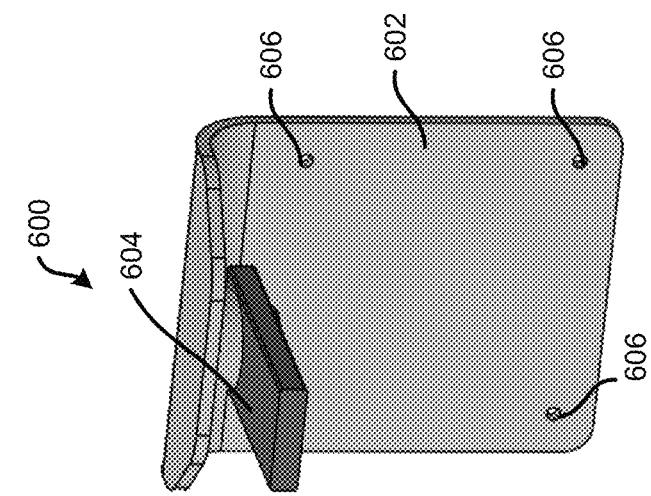
FIG. 6 is a diagram of another embodiment of a stand head for mounting a display device on a stand according to at least one embodiment of the present disclosure.

FIG. 6 illustrates a stand head 600 for mounting a display device, such as display device 204, on a stand according to at least one embodiment of the present disclosure. Stand head 600 includes a main plate 602 and an arm 604. Main plate 604 includes mounting holes 606. In certain examples, arm 604 may connect to a stand or other device to hold the display device. In an example, stand head 600 may be any suitable stand head to interface with a combination mounting bracket, such as combination mounting bracket 206 of FIG. 2. For example, stand head 600 may be a non-VESA compliant stand head, such that the stand head may not fit within main bracket 220 of FIG. 2. For example, the outer edges of main plate 602 may not fit within the side walls of main bracket 220. In certain examples, stand head 600 may on top of main bracket 220, and screws may be inserted through holes 606 to secure stand head 600 to the main bracket of combination mounting bracket 206.

Figure 7:
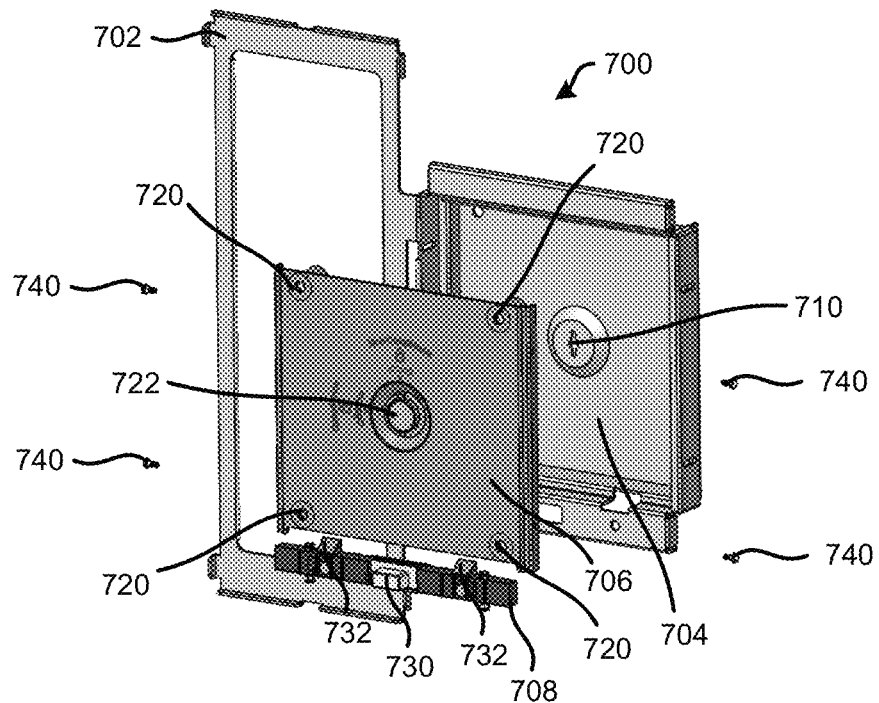
FIG. 7 is an exploded view of a combination mounting bracket according to at least one embodiment of the present disclosure.

FIG. 7 is a diagram illustrating an exploded view of a combination mounting bracket 700 according to at least one embodiment of the present disclosure. Combination mounting bracket 700 includes an information handling system mounting bracket 702, a main bracket 704, an adjustable bracket 706, and a quick release module 708. Main bracket 704 includes a locking hole 710. Adjustable bracket 706 includes mounting holes 720 and a locking mechanism 722. Quick release module 708 includes a release button 730 and a hooks 732. In an example, combination mounting bracket 700 may include additional components without varying from the scope of this disclosure. In certain examples, combination mounting bracket 700 may be any suitable mounting bracket including, but not limited to, mounting bracket 206 of FIG. 2.

In an example, adjustable bracket 706 may be inserted within main bracket 704 and held within the main bracket via the quick release module 708. For example, hooks 732 will hold adjustable bracket 706 within main bracket 704. In certain examples, a user may press release button 730 to push hooks 732 away from adjustable bracket 706 so that the adjustable bracket may be removed from main bracket 704. Combination mounting bracket 700 also includes sliding pins 740 to interface with both main bracket 704 and with adjustable bracket 706. In an example, sliding pins 740 may guide movement of the adjustable bracket within the main bracket as described below.

Figure 8:
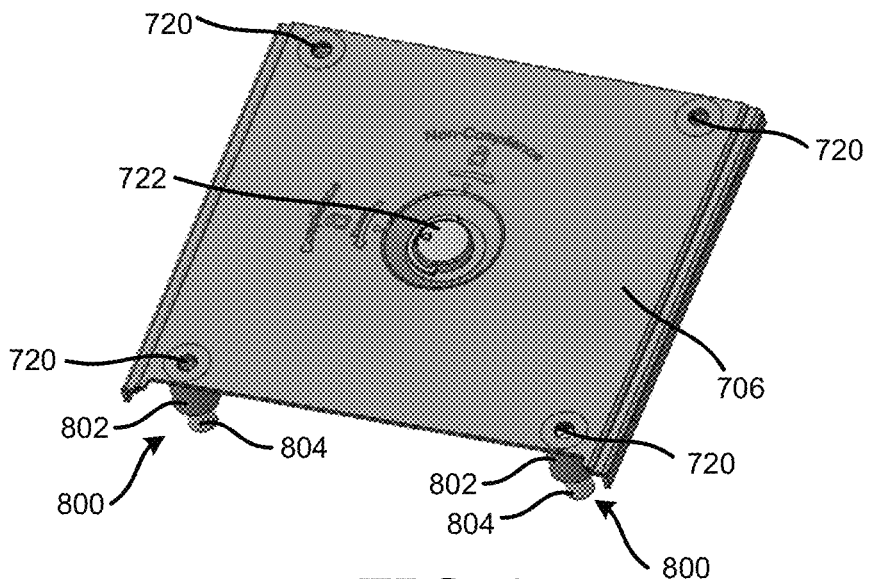
FIG. 8 is a perspective view of an adjustable bracket of the combination mounting bracket according to at least one embodiment of the present disclosure.

FIG. 8 illustrates a perspective view of adjustable bracket 706 of combination mounting bracket 700 according to at least one embodiment of the present disclosure. Adjustable bracket 706 includes retractable standoffs 800, which in turn include a fixed portion 802, and a retractable portion 804. Adjustable bracket 706 also includes mounting holes 720, and locking mechanism 722. In an example, each retractable standoff 800 may be secured to adjustable bracket 706 in any suitable manner including, but not limited to, fixed portion 802 being riveted to adjustable bracket 706.

Figure 9:
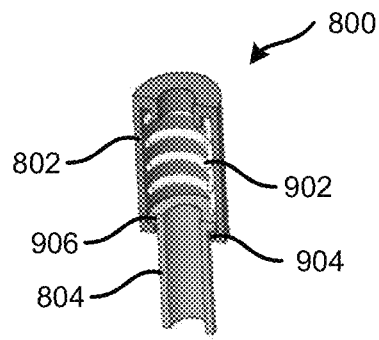
FIGS. 9 and 10 are cross sectional views of a standoff for the adjustable bracket according to at least one embodiment of the present disclosure.
Figure 10:
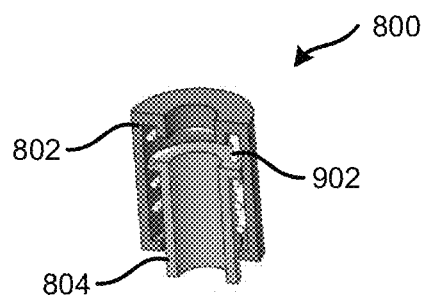

FIGS. 9 and 10 illustrate a cross sectional view of retractable standoff 800 for adjustable bracket 706 according to at least one embodiment of the present disclosure. Retractable standoff 800 includes a spring 902, fixed portion 802, and retractable portion 804. Fixed portion 802 includes a lip 904, and retractable portion 804 includes a top rim 906. In an example, spring 902 may be placed in physical communication with a top of fixed portion 802 and with top rim 906 of retractable portion 804. Based on spring being located in between the top of fixed portion 802 and top rim 906, the spring may bias retractable portion 804 in an extended position as shown in FIG. 9. In the extended position, spring 902 may exert a force on top rim 906 of retractable portion 804, which may cause the retractable portion to extend from fixed potion 802 and the top rim to be placed in physical communication with lip 904. In an example, the force from spring 902 may bias retractable standoff 800 in the extended position with retractable portion 804 extending out of fixed portion 802.

Referring now to FIG. 10, retractable standoff 800 may be in a retracted position. In the retracted position, retractable portion 804 may be inserted to a determined location within fixed portion 802. In an example, the determined location may be any suitable location within fixed portion 802 including, but not limited to, a location fixed based on spring 902 being compressed between the top of fixed portion 802 and the top of retractable portion 804. In certain examples, retractable standoff 800 may transition from the extended position to the retracted position based on an external force being applied to the retractable standoff. In an example, the external force should be greater than the force exerted by spring 902 so that the retractable portion 804 may be pushed within fixed portion 802 and retractable standoff 800 may be placed in the retracted position.

Figure 11:
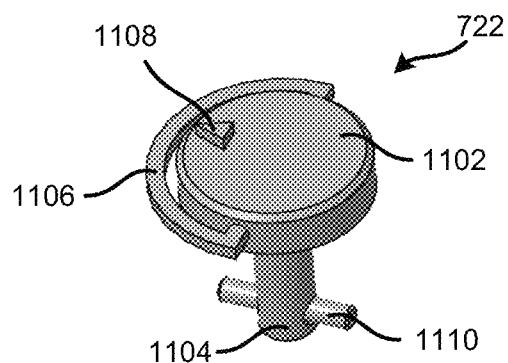
FIG. 11 is a perspective view of a locking mechanism according to at least one embodiment of the present disclosure.

FIG. 11 illustrates a perspective view of locking mechanism 722 according to at least one embodiment of the present disclosure. Locking mechanism 722 includes a head 1102, a shaft 1104, a handle 1106, a pointer 1108, and a lock pin 1110. In an example, shaft 1104 may extend downward and perpendicular direction from head 1102. Lock pin 1110 may be placed at an end of shaft 1104 that is a distal end from head 1102. In an example lock pin 1110 may be any suitable pin including, but not limited to, a single pin extending through shaft 1104 and two separate pins connected to the shaft. In an example, handle 1106 may be utilized to transition locking mechanism 722 between a compliant position and a non-compliant position. In certain examples, pointer 1108 may point at different locations on an adjustable bracket, such as adjustable bracket 706 of FIGS. 7 and 8. The different locations may indicate any suitable information including, but not limited to, information indicating that a combination mounting bracket, such as combination mounting bracket 700 of FIG. 7, is in either a VESA compliant configuration or a non-VESA compliant configuration.

Figure 12:
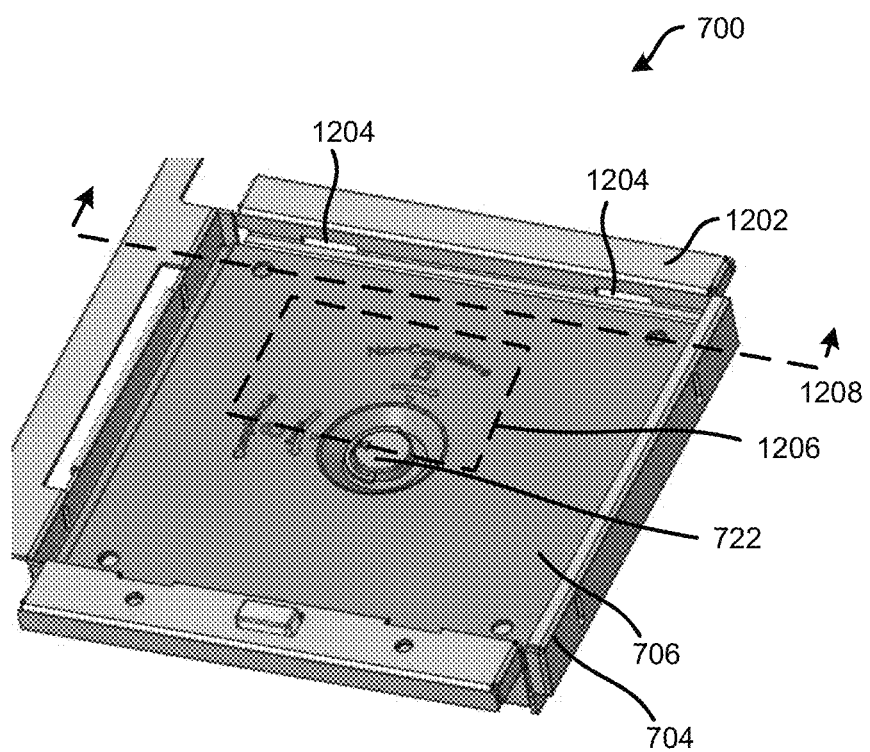
FIG. 12 is a perspective view of the combination mounting bracket in a first configuration according to at least one embodiment of the present disclosure.

FIG. 12 illustrates a perspective view of a combination mounting bracket 700 in a first configuration according to at least one embodiment of the present disclosure. Combination mounting bracket 700 includes main bracket 704, adjustable bracket 706, and locking mechanism 722. Main bracket 704 includes a top surface 1202, and slots 1204. In the example of FIG. 12, combination mounting bracket 700 is in a first configuration, such as a compliant configuration. In certain examples, the compliant configuration may be for compliance to any set of rules such as VESA compliance. In this configuration, adjustable bracket 706 may be below top surface 1202 of main bracket 704, such that slots 1204 may be accessible by a head stand. Additional details of combination mounting bracket 700 will be described with respect to FIG. 13, which illustrates a cross section of a portion of the combination mounting bracket along the box respected by dashed line 1206.

Figure 13:
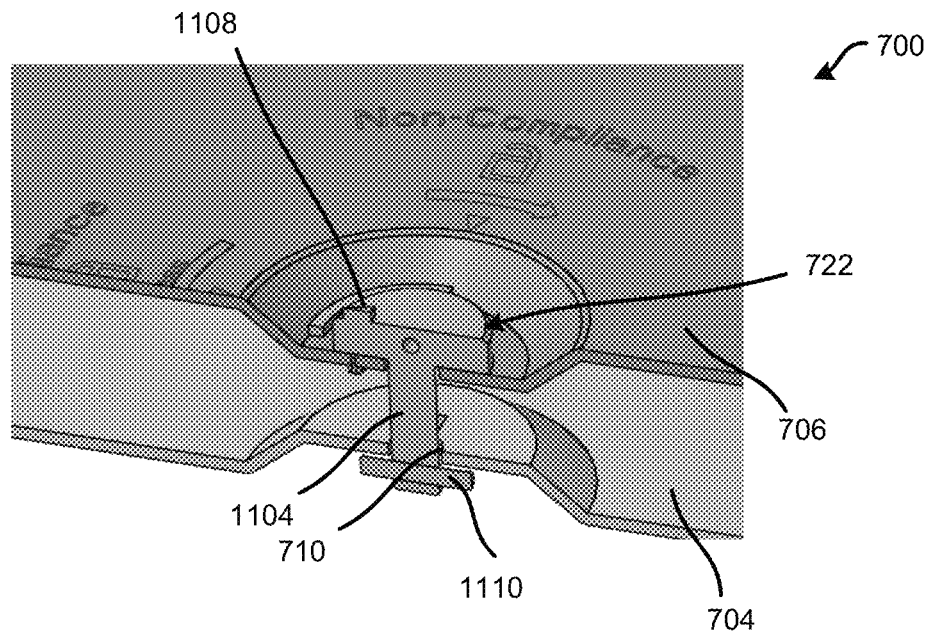
FIG. 13 is a cross sectional view of the combination mounting bracket in the first configuration according to at least one embodiment of the present disclosure.

FIG. 13 illustrates a cross sectional view of combination mounting bracket 700 along dashed line 1206 of FIG. 12 while the combination mounting bracket is in the first configuration according to at least one embodiment of the present disclosure. As shown in FIG. 13, shaft 1104 of locking mechanism 722 may be inserted through locking hole 710 of main bracket 704. In an example, locking mechanism 722 may be rotated such that locking pin 1110 is perpendicular to locking hole 710. In this example, locking pin 1110 may be in physical communication with a bottom surface of main bracket 704 to secure and hold combination mounting bracket 700 in the compliant configuration, such that adjustable bracket 706 is below a top surface of main bracket 704 as described above with respect to FIG. 12. Pointer 1108 may point toward information indicating that combination mounting bracket is in the compliance configuration.

Figure 14:
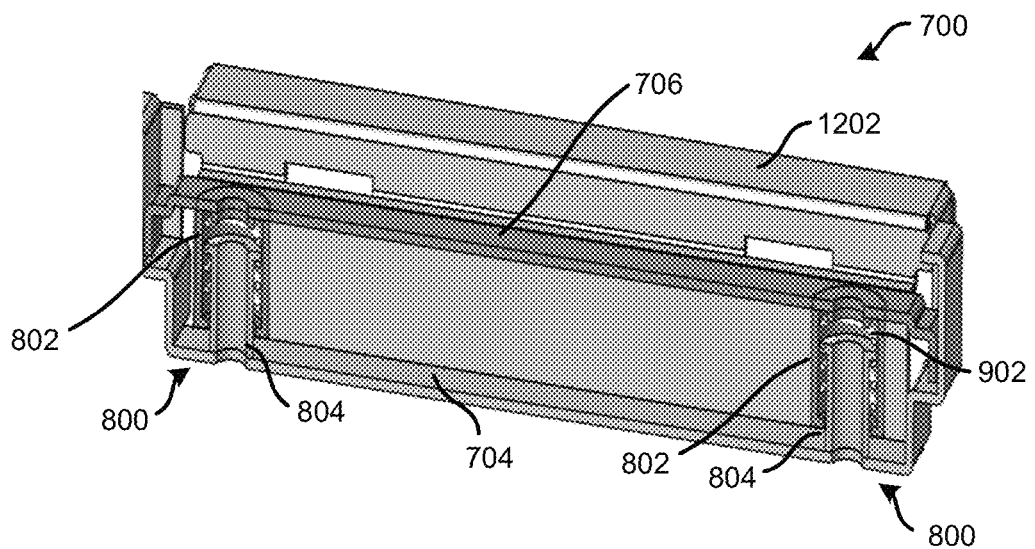
FIG. 14 is a cross sectional view of standoffs of the combination mounting bracket in the first configuration according to at least one embodiment of the present disclosure.

FIG. 14 illustrates a cross sectional view of combination mounting bracket 700 along dashed line 1208 of FIG. 12 while the combination mounting bracket is in the first configuration according to at least one embodiment of the present disclosure. While combination mounting bracket 700 is in the compliance configuration, retractable standoffs 800 may be in the retracted position. As described above, retractable standoffs 800 may be in the retracted position in response to an external force exceeding the force of spring 902, such that the spring is compressed and retractable portion 804 is pushed within fixed portion 802. In the compliance configuration, adjustable bracket 706 is below top surface 1202 of main bracket 704.

Figure 15:
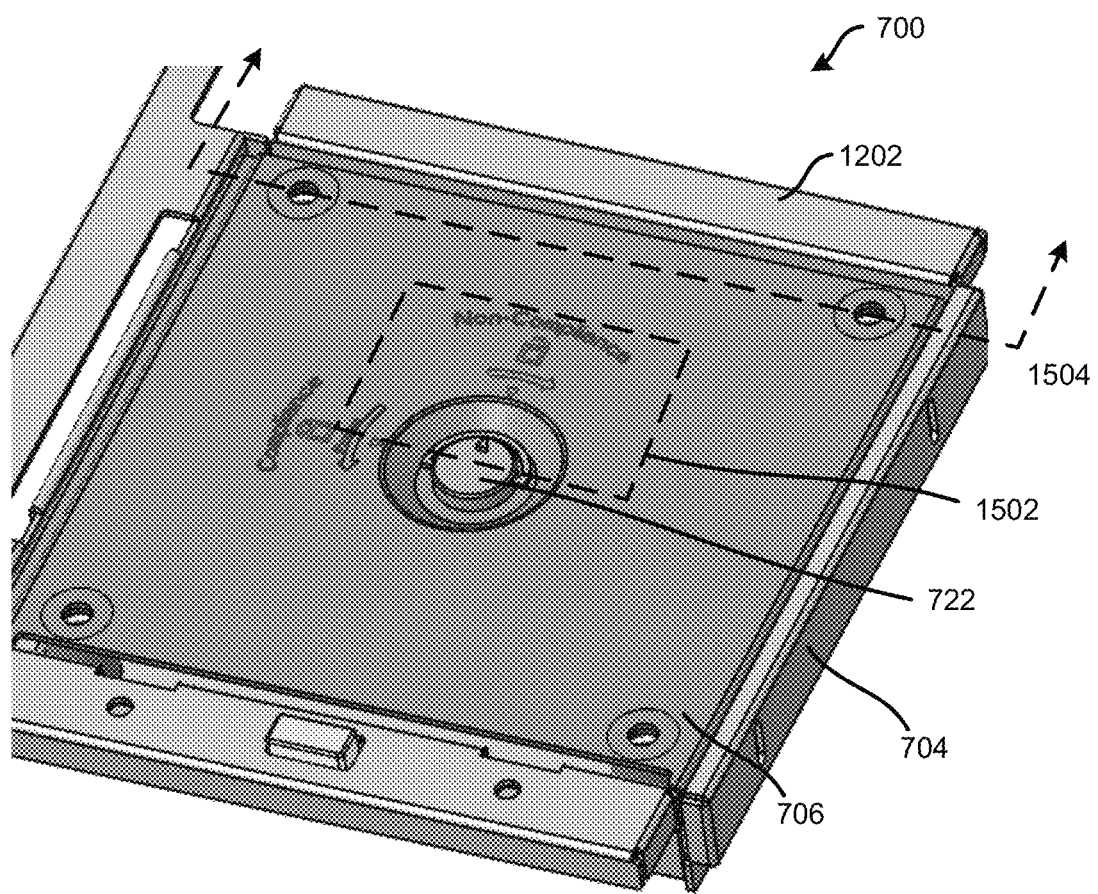
FIG. 15 is a perspective view of the combination mounting bracket in a second configuration according to at least one embodiment of the present disclosure.

FIG. 15 illustrates a perspective view of a combination mounting bracket 700 in a second configuration according to at least one embodiment of the present disclosure. Combination mounting bracket 700 includes main bracket 704, adjustable bracket 706, and locking mechanism 722. Main bracket 704 includes top surface 1202. In the example of FIG. 15, combination mounting bracket 700 is in the second configuration, such as a non-compliant configuration. In certain examples, the non-compliant configuration may be for non-compliance to any set of rules, such as VESA compliance. In this configuration, adjustable bracket 706 may be substantially even with top surface 1202 of main bracket 704, such that slots of the main bracket are not accessible by a head stand. Additional details of combination mounting bracket 700 will be described with respect to FIG. 16, which illustrates a cross section of a portion of the combination mounting bracket along the box respected by dashed line 1502.

Figure 16:
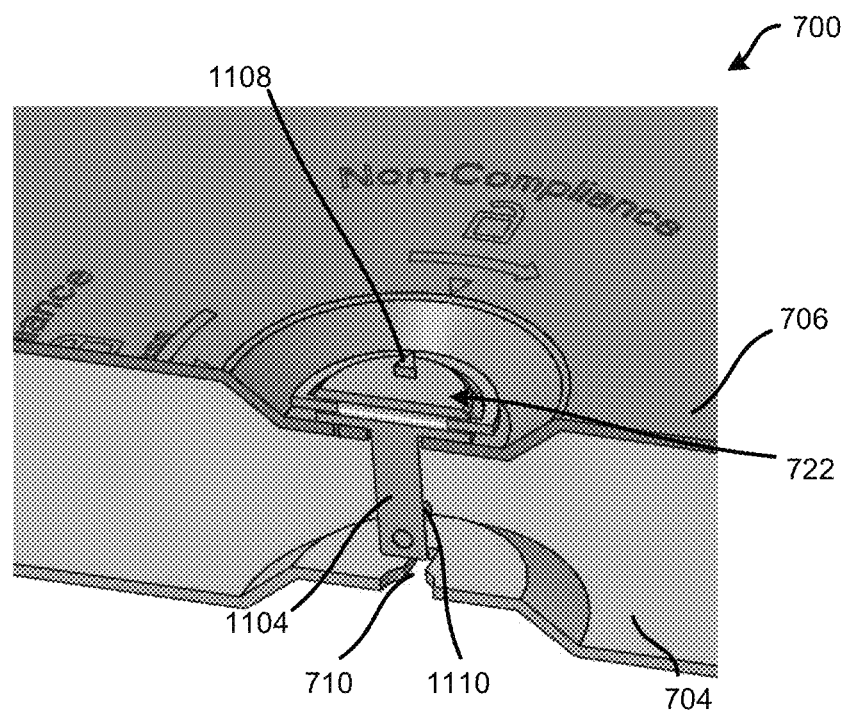
FIG. 16 is a cross sectional view of the combination mounting bracket in the second configuration according to at least one embodiment of the present disclosure.

FIG. 16 illustrates a cross sectional view of combination mounting bracket 700 along dashed line 1502 of FIG. 15 while the combination mounting bracket is in the first configuration according to at least one embodiment of the present disclosure. As shown in FIG. 16, shaft 1104 of locking mechanism 722 is above locking hole 710 of main bracket 704. In an example, locking mechanism 722 may be rotated such that locking pin 1110 is parallel with locking hole 710. In this example, locking pin 1110 slide out of locking hole 710 of main bracket 704 enable combination mounting bracket 700 to be in the non-compliant configuration, such that adjustable bracket 706 substantially equal with a top surface of main bracket 704 as described above with respect to FIG. 15. Pointer 1108 may point toward information indicating that combination mounting bracket is in the non-compliance configuration as shown in FIG. 16.

Figure 17:
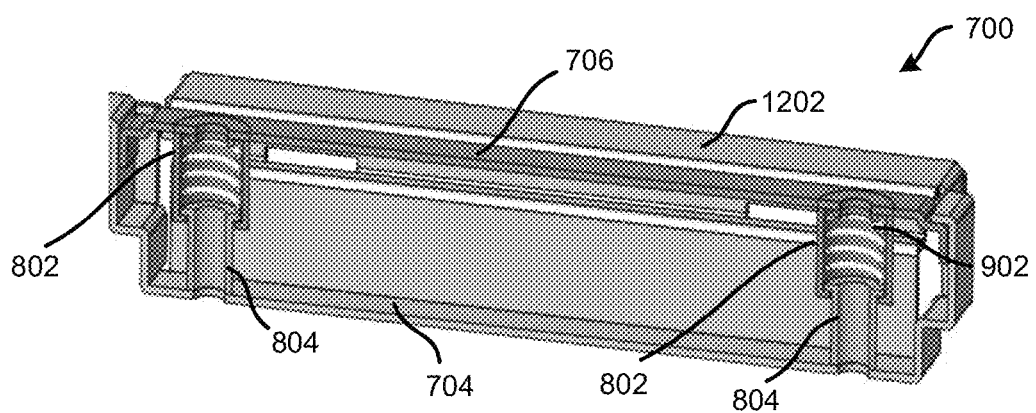
FIG. 17 is a cross sectional view of standoffs of the combination mounting bracket in the second configuration according to at least one embodiment of the present disclosure.

FIG. 17 illustrates a cross sectional view of combination mounting bracket 700 along dashed line 1504 of FIG. 12 while the combination mounting bracket is in the second configuration according to at least one embodiment of the present disclosure. While combination mounting bracket 700 is in the non-compliance configuration, retractable standoffs 800 may be in the extended position. As described above, retractable standoffs 800 may be in the extended position in response to the force of spring 902 pushing retractable portion from fixed portion 802. In an example, as locking mechanism 722 is rotated from the compliance location to the non-compliance location, adjustable bracket 706 may automatically pop up via the force of spring 902. In the non-compliance configuration, adjustable bracket 706 substantially equal with top surface 1202 of main bracket 704.

Figure 18:
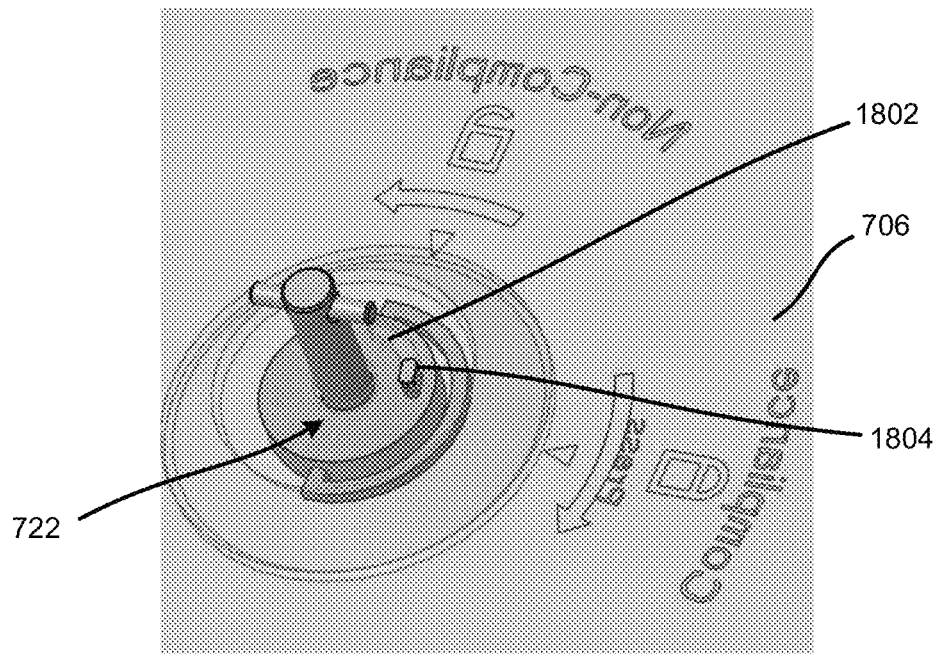
FIG. 18 is a diagram illustrating the locking mechanism of the combination mounting bracket in a first alignment according to at least one embodiment of the present disclosure.
Figure 19:
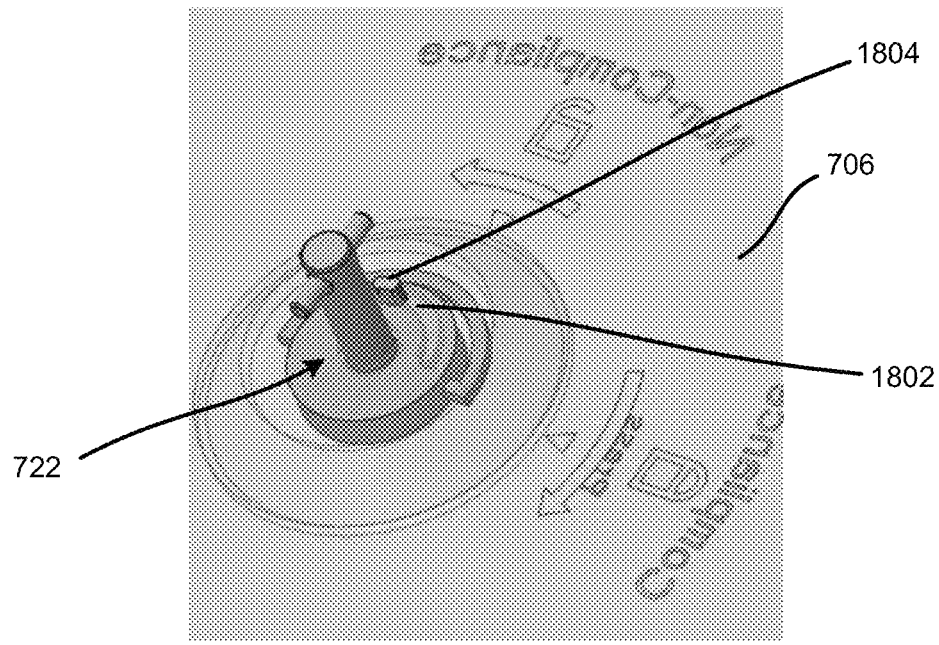
FIG. 19 is a diagram illustrating the locking mechanism of the combination mounting bracket in a first alignment according to at least one embodiment of the present disclosure.

FIGS. 18 and 19 illustrate locking mechanism 722 of in first and second alignments according to at least one embodiment of the present disclosure. Adjustable bracket 706 includes a lock channel 1802. Locking mechanism 722 includes a guide pin 1804. In an example, lock channel 1802 and guide pin 1804 may combine to control the transition of locking mechanism between the first and second alignments. For example, lock channel 1802 may extend is a arching line from the orientation of locking mechanism 722 while the combination mounting bracket is in the compliance configuration to the orientation of locking mechanism 722 while the combination mounting bracket is in the non-compliance configuration. In an example, guide pin 1804 may move from one end of lock channel 1802 to the other while locking mechanism is rotated.

Figure 20:
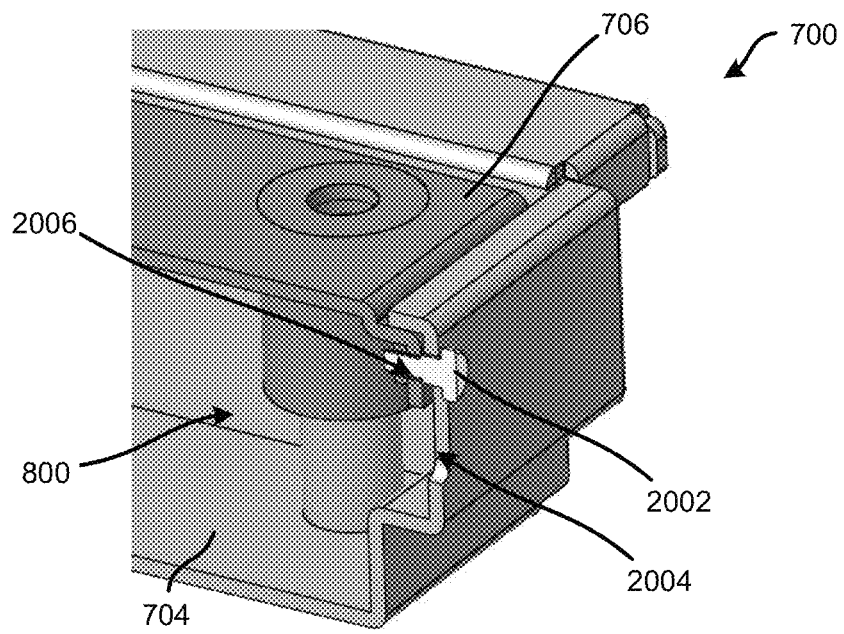
FIG. 20 is a cross sectional view of the combination mounting bracket with a sliding pin in a first alignment according to at least one embodiment of the present disclosure.
Figure 21:
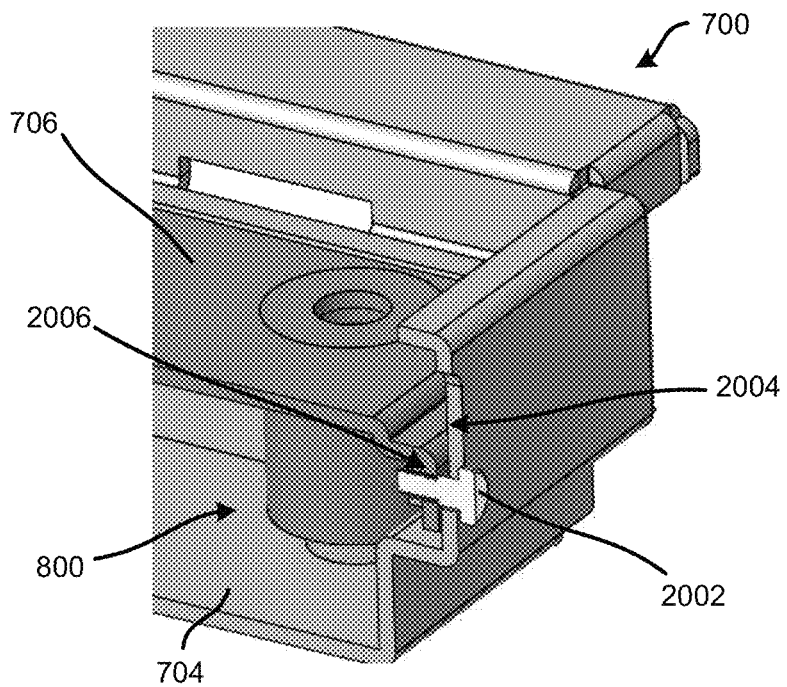
FIG. 21 is a cross sectional view of the combination mounting bracket with a sliding pin in a second alignment according to at least one embodiment of the present disclosure.

FIGS. 20 and 21 illustrate a cross sectional view of combination mounting bracket 700 according to at least one embodiment of the present disclosure. Combination mounting bracket includes a sliding pin 2002, a sliding channel 2004, and a connection hole 2006. In an example, sliding pin 202 may be utilized to assemble combination mounting bracket 700. For example, sliding pin 2002 may be inserted through slide channel 2004 and securely connected to connection hole 2006. In this example, sliding pin 2002 may hold main bracket 704 in physical communication with adjustable bracket 706. In response to combination mounting bracket 700 being in the non-compliance configuration, retractable standoff 800 may be in the extended position and sliding pin 2002 may be located at a top end of sliding channel 2004 as shown in FIG. 20. In response to combination mounting bracket 700 being in the compliance configuration, retractable standoff 800 may be in the collapsed position and sliding pin 2002 may be located at a bottom end of sliding channel 2004 as shown in FIG. 21.

FIGS. 22-24 illustrate stand heads 400, 500, and 600 connecting to combination mounting bracket 700 according to at least one embodiment of the present disclosure. Referring now to FIG. 22, combination mounting bracket 700 may be in the compliance configuration to receive stand head 400. For example, adjustable bracket 706 may be located below top surface 1202 of main bracket 704. In this example, the dimensions of stand head 400 may be any suitable size to enable the stand head to fit within the edges of main bracket 704.

Referring now to FIG. 23, combination mounting bracket 700 may be in the compliance configuration to receive stand head 500. For example, adjustable bracket 706 may be located below top surface 1202 of main bracket 704. In this example, the dimensions of stand head 500 may be any suitable size to enable the stand head to fit within the edges of main bracket 704. Referring now to FIG. 24, combination mounting bracket 700 may be in the non-compliance configuration to receive stand head 600. For example, adjustable bracket 706 may be located substantially equal to top surface 1202 of main bracket 704. In this example, the dimensions of stand head 600 may be any suitable size, such that the stand head may not fit within the edges of main bracket 704. While in the non-compliance configuration, adjustable bracket 706 may be substantially equal to top surface 1202 to provide sufficient support for stand head 600 and to allow the stand head to connect to combination mounting bracket 700.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A combination mounting bracket for an information handling system, the combination mounting bracket comprising:
    a main bracket configured to be securely mounted on a display device; and
    an adjustable bracket to fit within the main bracket, the adjustable bracket including:
        a mounting surface configured to be placed in physical communication with a stand for the display device; and
        a plurality of standoffs in physical communication with the mounting surface and with the main bracket, the standoffs configured to transition between an extended position and a compressed position, wherein each of the standoffs is in the compressed position when a stand that is compliant with a mounting standard is connected to the mounting surface of the adjustable bracket and is in the extended position when a stand that is not compliant with the mounting standard is connected to the mounting surface.

2. The combination mounting bracket of claim 1, further comprising:
    a locking mechanism in physical communication with the mounting surface of the adjustable bracket, the locking mechanism including:
        a shaft to extend through the mounting surface; and
        a locking pin to be in physical communication with the main bracket when the standoffs are in the compressed position, wherein the locking pin is configured to hold the standoffs in the compressed position based on the physical communication between the locking pin and the main bracket.

3. The combination mounting bracket of claim 2, wherein the locking mechanism further includes a guiding pin to enable the locking mechanism to travel between a compliance position and a non-compliance position.

4. The combination mounting bracket of claim 3, wherein the adjustable bracket includes a guide channel to interface with the guiding pin, wherein the guide channel extends from the compliance position to the non-compliance position.

5. The combination mounting bracket of claim 1, wherein each of the standoffs include:
    a first portion physically secured to a bottom surface of the adjustable bracket;
    a second portion located within the first portion, wherein the second portion retracts to a first position within the first portion when the corresponding standoff is in the extended position and to extend from the first position to a second position when the corresponding standoff is in the compressed position; and
    a spring located between a top of the second portion and a inner surface of the first portion, wherein the spring is configured to bias the second portion towards the second position.

6. The combination mounting bracket of claim 1, further comprising:
    a plurality of sliding pins in physical communication with the main bracket and with the adjustable bracket, wherein each of the sliding pins is inserted through a corresponding channel of the main bracket and is physically connected to the adjustable bracket, wherein the sliding pins enable the adjustable bracket to move toward and away from a surface of the main bracket.

7. The combination mounting bracket of claim 1, further comprising:
    an information handling system bracket in physical communication with the main bracket, the information handling system bracket to mount the information handling system to the combination mounting bracket.

8. A system comprising:
an information handling system;
a display device; and
a combination mounting bracket including:
- a main bracket configured to be securely mounted on the display device;
- an information handling system bracket in physical communication with the main bracket, the information handling system bracket to mount the information handling system to the combination mounting bracket; and
- an adjustable bracket to fit within the main bracket, the adjustable bracket including:
  - a mounting surface configured to be placed in physical communication with a stand for the display device; and
  - a plurality of standoffs in physical communication with the mounting surface and with the main bracket, the standoffs configured to transition between an extended position and a compressed position, wherein each of the standoffs include:
    - a first portion physically secured to a bottom surface of the adjustable bracket;
    - a second portion located within the first portion, wherein the second portion retracts to a first position within the first portion when the corresponding standoff is in the extended position and extends from the first position to a second position when the corresponding standoff is in the compressed position; and
    - a spring located between a top of the second portion and an inner surface of the first portion, wherein the spring is configured to bias the second portion towards the second position.

9. The system of claim 8, further comprising:
a locking mechanism in physical communication with the mounting surface of the adjustable bracket, the locking mechanism including:
- a shaft to extend through the mounting surface; and
- a locking pin to be in physical communication with the main bracket when the standoffs are in the compressed position, wherein the locking pin is configured to hold the standoffs in the compressed position based on the physical communication between the locking pin and the main bracket.

10. The system of claim 9, wherein the locking mechanism further includes a guiding pin to enable the locking mechanism to travel between a compliance position and a non-compliance position.

11. The system of claim 10, wherein the adjustable bracket includes a guide channel to interface with the guiding pin, wherein the guide channel extends from the compliance position to the non-compliance position.

12. The system of claim 8, wherein each of the standoffs is in the compressed position when a stand that is compliant with a mounting standard is connected to the mounting surface of the adjustable bracket and is in the extended position when a stand that is not compliant with the mounting standard is connected to the mounting surface.

13. The system of claim 8, further comprising:
a plurality of sliding pins in physical communication with the main bracket and with the adjustable bracket, wherein each of the sliding pins is inserted through a corresponding channel of the main bracket and is physically connected to the adjustable bracket, wherein the sliding pins enable the adjustable bracket to move toward and away from a surface of the main bracket.

14. A combination mounting bracket for an information handling system, the combination mounting bracket comprising:
- a main bracket configured to be securely mounted on a display device;
- an adjustable bracket disposed within the main bracket, the adjustable bracket including:
  - a mounting surface configured to be placed in physical communication with a stand for the display device; and
  - a plurality of standoffs in physical communication with the mounting surface and with the main bracket, the standoffs configured to transition between an extended position and a compressed position;
- a locking mechanism in physical communication with the mounting surface of the adjustable bracket, the locking mechanism including:
  - a shaft extending through the mounting surface; and
  - a locking pin in physical communication with the main bracket when the standoffs are in the compressed position, wherein the locking pin is configured to hold the standoffs in the compressed position based on the physical communication between the locking pin and the main bracket; and
- a plurality of sliding pins in physical communication with the main bracket and with the adjustable bracket, wherein each of the sliding pins is inserted through a corresponding channel of the main bracket and is physically connected to the adjustable bracket, wherein the sliding pins enable the adjustable bracket to move toward and away from a surface of the main bracket.

15. The combination mounting bracket of claim 14, wherein the locking mechanism further includes a guiding pin to enable the locking mechanism to travel between a compliance position and a non-compliance position.

16. The combination mounting bracket of claim 15, wherein the adjustable bracket includes a guide channel to interface with the guiding pin, wherein the guide channel extends from the compliance position to the non-compliance position.

17. The combination mounting bracket of claim 14, wherein each of the standoffs include:
- a first portion physically secured to a bottom surface of the adjustable bracket;
- a second portion located within the first portion, wherein the second portion retracts to a first position within the first portion when the corresponding standoff is in the extended position and to extend from the first position to a second position when the corresponding standoff is in the compressed position; and
- a spring located between a top of the second portion and a inner surface of the first portion, wherein the spring is configured to bias the second portion towards the second position.

18. The combination mounting bracket of claim 14, wherein each of the standoffs is in the compressed position when a stand that is compliant with a mounting standard is connected to the mounting surface of the adjustable bracket and is in the extended position when a stand that is not compliant with the mounting standard is connected to the mounting surface.

* * * * *